United States Patent [19]

Bezuk et al.

[11] Patent Number: 4,845,542
[45] Date of Patent: Jul. 4, 1989

[54] INTERCONNECT FOR LAYERED INTEGRATED CIRCUIT ASSEMBLY

[75] Inventors: Steve J. Bezuk, Inver Grove Heights; Tushar R. Gheewala, Eagan; Stephen A. Campbell, Woodbury, all of Minn.; Robert J. Baseman, Pleasantville, N.Y.

[73] Assignee: Unisys Corporation, Blue Bell, Pa.

[21] Appl. No.: 298,806

[22] Filed: Jan. 17, 1989

Related U.S. Application Data

[63] Continuation of Ser. No. 27,920, Mar. 19, 1987, abandoned.

[51] Int. Cl.⁴ .............................................. H01L 23/48
[52] U.S. Cl. ........................................ 357/68; 357/69; 357/65; 357/75
[58] Field of Search .................... 357/68, 69, 65, 75

[56] References Cited

U.S. PATENT DOCUMENTS

| | | | |
|---|---|---|---|
| 4,021,838 | 5/1977 | Warwick | 357/68 |
| 4,074,342 | 2/1978 | Honn et al. | 357/68 |
| 4,151,543 | 4/1979 | Hayakawa et al. | 357/68 |
| 4,545,610 | 10/1985 | Lakvitz et al. | 357/68 |

Primary Examiner—Martin H. Edlow
Attorney, Agent, or Firm—Charles J. Fassbender; Robert S. Bramson

[57] ABSTRACT

Enhanced density of electrical and/or mechanical interconnections between adjacent wafers within integrated circuit assemblies and structural integrity of those interconnections under temperature cycling conditions, is attained by utilizing laser assisted chemical vapor deposition to fabricate precisely configured metal posts which serve as such interconnections.

11 Claims, 2 Drawing Sheets

INTERCONNECT FOR LAYERED INTEGRATED CIRCUIT ASSEMBLY

This is a continuation of co-pending application Ser. No. 027,920, filed Mar. 19, 1987.

BACKGROUND OF THE INVENTION

This invention relates to layered integrated circuit assemblies and more specifically to fabrication of metal posts by laser assisted chemical vapor deposition, for utilization as electrical and/or mechanical interconnections therein.

Interconnecting the integrated circuitry on a plurality of wafers has progressed from the use of motherboards and/or cables, to stacking the wafers in layered assemblies wherein a plurality of permanent metal interconnections and made between aligned locations on the wafers. Although most such interconnections are intended for passing electrical signals, mechanical purposes are also known therefor.

Various metalization systems or techniques, including the use of non-configured metal bumps are known in the prior art for providing such interconnections, with the most popular at the present time being the use of solder bumps. All such prior art techniques involve the time consuming use of masks, such as for the application of photoresist, and/or result in rather low density populations of the interconnections and therefore, fail to provide the high number of input and output terminals that are required for today's complex circuitry. Furthermore, the interconnections which result from some prior art techniques have little structural integrity under temperature cycling conditions.

SUMMARY OF THE INVENTION

This invention relates to layered integrated circuit assemblies, which are enhanced thereby to have an increased density of electrical and/or mechanical interconnections between adjacent integrated circuit wafers therein, and also to improve the structural integrity of such interconnections under temperature cycling conditions. These enchancements are accomplished by specifically configuring the interconnections as metal posts, with each post being fabricated through the use of laser assisted chemical vapor deposition to have a high aspect ratio, without using masks.

DISCLOSURE OF THE PREFERRED EMBODIMENTS

Figure 1:
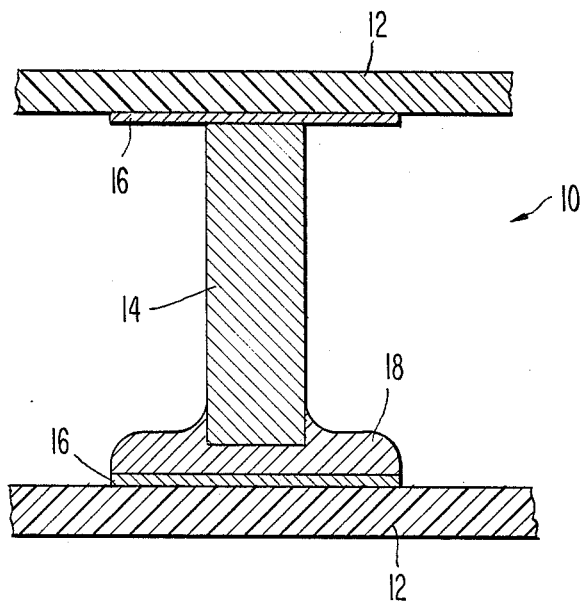
FIG. 1 is a cross sectional view through part of a layered integrated circuit assembly, and illustrates the invention at a single interconnection between adjacent integrated circuit wafers thereof.

In the interest of simplicity, only a portion of a layered integrated circuit assembly 10 to which this invention relates, is illustrated in FIG. 1. Wafers 12 containing the integrated circuitry are interconnected in the layered assembly by posts 14 (only one shown) which extend between the wafers 12 and are affixed to bonding pads 16 thereon. The spacing between the wafers 12 is greatly exaggerated to better illustrate the construction of the circuit assembly 10. Typically, the bonding pads 16 are located as the input/output terminals on each wafer 12 and the material thereof is the same metal as that utilized for the interconnects in the integrated circuitry of the wafers 12. One end of each post 14 is affixed to the lower wafer 12 by mechanical bonding such as with solder 18, while the other end is affixed to the upper wafer 12 when the post 14 is fabricated thereon by laser assisted chemical vapor deposition, in accordance with this invention. The bonding pads 16 may be plated with a suitable metal to facillitate the mechanical bonding of the posts 14 thereto. Such plating is well known in present-solder bump technologies and may be performed either before or after the posts 14 are deposited, but is usually performed before such deposition.

Figure 2:
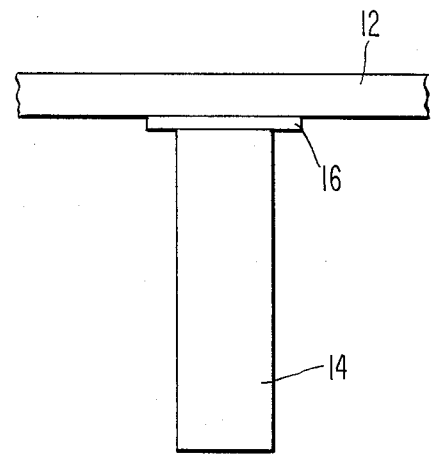
FIG. 2 is a partial view of an integrated circuit wafer, as taken from the layered assembly of FIG. 1, and illustrates a specifically configured interconnection post that is fabricated thereon by laser assisted chemical vapor deposition.

As illustrated in FIG. 2, fabrication of the posts 14 on the pads 16 of the wafers 12 is accomplished prior to joining the wafers 12 in the layered assembly 10. In FIG. 2, the same reference numerals are applied to elements which are identical to those discussed previously in regard to FIG. 1. The posts 14 can be fabricated on either or both of the adjacently disposed wafers 12 in the layered assembly 10. Consideration must be given when fabricating the posts 14, to the fact that the free ends thereof will thereafter be joined by the solder 18 to the pads 16 on another wafer 12 and therefore, the material of the posts 14 must be compatible or be made compatible for solder bonding.

Before adjacent wafers 12 can be joined for the layered assembly 10, the pads 16 to which the posts 14 are to be soldered must be compatible or made compatible for solder bonding. Assuming such compatibility exists, adjacent wafers 12 are joined by first applying flux to the free ends of the posts 14 and the bonding pads 16 to which affixment of such posts 14 is intended. Then, using conventional techniques, the wafers 12 are aligned relative to each other as desired for final disposition in the layered assembly 10. Heat is applied to wet the solder 18 and activate the flux at the interfaces between the posts 14 and the pads 16. The solder 18 is then allowed to cool and becomes homogeneously solid to thereby interconnect the wafers 12. Thereafter, no interface exists between the posts 14 and the pads 16, and the flux residue is removed from the joined wafers 12 using some conventional technique.

Figure 3:
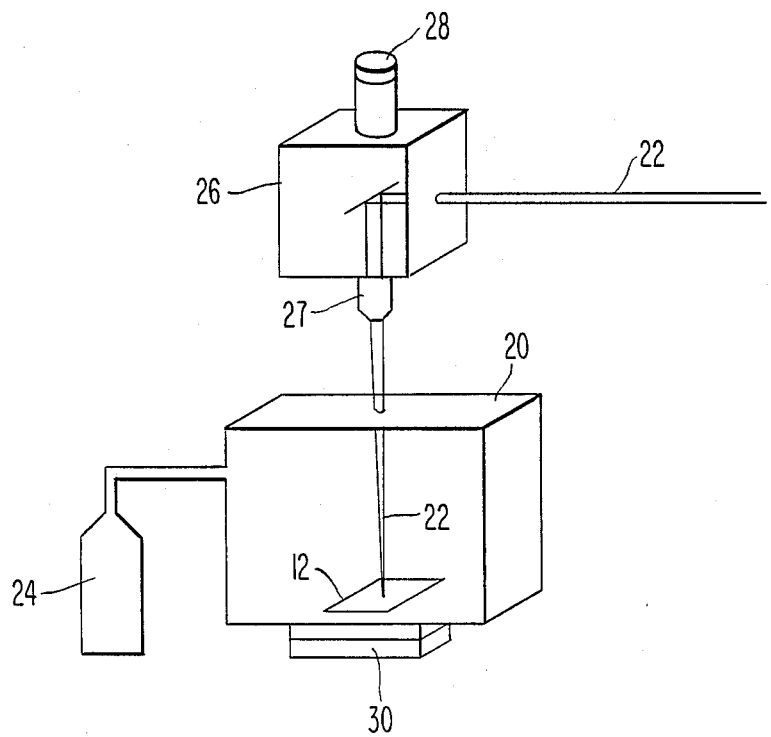
FIG. 3 illustrates a suitable laser assisted chemical vapor deposition apparatus for fabricating the posts shown in FIGS. 1 and 2.

In accordance with the invention, the posts 14 are fabricated by laser assisted chemical vapor desposition performed with suitable apparatus, such as that illustrated in FIG. 3. Wafers 12 having the posts 14 fabricated thereon, are fixedly positioned within a reaction chamber 20 into which a laser beam 22 is directed to decompose a chemical species and deposit metal therefrom on the wafers 12. The chemical species may be deposited on the surface of the wafers 12 or the chamber 20 may be charged therewith from either a gaseous or liquid source 24 thereof. When the source 24 is liquid, as is the case in the preferred embodiment of the invention, the natural vapor pressure above the liquid is flowed into a vacuum system, thereby raising the pressure therein to the vapor pressure of the source 24 or below. Deposition of the posts 14 is normally done at less than atmospheric pressure, however, an inert or reactive gass could be utilized to raise the total pressure in the system to approxiamtely one atmosphere.

The laser beam 22 is folded into an optical path and targeted on the wafers 12 by a microscope 26 which has an objective lense 27 to focus or localize the beam 22. After passing through the microscope 26, the laser beam 22 enters the reaction chamber 20 and ultimately impinges on the surface of the wafers 12 which is viewable through an occular lense 28 of the microscope 26. A viewing means (not shown), such as a TV camera, may be disposed behind the occular lense 28 to produce an image signal for use in positioning the wafers 12 by computer control, such as through an X-Y translational device 30.

The decomposing of the chemical species which results in metal deposition to fabricate the posts 14 on the wafers 12, occurs directly thereon without the use of any mask and photoresist processing. Such metal deposition can be localized to very small areas, typically no greater than one mil and less than 0.5 mil has been achieved therewith, due to the submicron confinement that is made possible by focusing the laser beam 22 with the microscope 26. The height attained for each post 14 is directly related to the time allowed for the chemical species to decompose at the location where the laser beam 22 is focused, with a height of 100 micrometers typically requiring no more than ten seconds to deposit. However, for some post materials and deposition conditions, such heights can be attained in less than one second. Consequently, for any fixed height of the posts 14, a much greater height to width or aspect ratio is possible relative to that attainable for prior art wafer interconnects, such as solder bumps. Of course, once the height of the posts 14 is fixed, the number of wafer interconnects that can be located on any given surface area of the wafers 12 is directly related to the aspect ratio of such interconnects. Therefore the greater the aspect ratio of the posts 14, the greater the number of posts 14 that can be located on the wafers 12 and also, the greater the number of electrical and/or mechanical interconnections that can be made between the wafers 12. Consequently, the laser assisted chemical vapor deposited posts 14 of this invention actually provide for a greater number of input/output terminals between adjacent wafers 12 in the layered assemblies 10.

The posts 14 can also be fabricated with a wide variety of pure metals and metal alloys, or as a graded metalization having different pure metals or metal alloys deposited at various positions along the length thereof. One such graded metalization would start with aluminum on the bonding pad 16 and finish with lead/tin at the free end of the post 14 to facilitate the above described process for joining adjacently disposed wafers 12 in the layered assembly 10. When this material variability is combined with the dimensional and configurational variability that is discussed in detail below, the flexure characteristics of the posts 14 can be widely varied. Therefore, the flexure characteristics of the posts 14 may be predetermined to avoid the structural integrity problems that are commonly experienced with prior art wafer interconnects, such as solder bumps, due to plastic deformation caused by thermal strain.

While laser assisted chemical vapor deposition is not extremely difficult to accomplish, attention must be given to several individual considerations, if desired results are to be obtained. As the initial consideration, it should be decided whether pyrolytic deposition with thermal energy or photolytic deposition with radiant energy is to be utilized. Some pyrolytic deposits, such as aluminum and zinc derived by decomposing methylated chemical species, exhibit high electrical resistivities due to carbon impurities, whereas such impurities are significantly reduced for the corresponding photolytic deposits.

However, pyrolytic deposits of nickel derived by decomposing nickel carbonyl are relatively pure and consequently, exhibit acceptable electrical resistivities. Furthermore, the physical characteristics of the wafers, such as surface reflectivity and thermal conductivity, will enter into this decision. For example, a wafer having an oxide substrate with a thin layer of silicon is ideal for pyrolytic deposition because the silicon will readily absorb thermal energy and the thermal conductivity of the oxide is very low.

The nature of the chemical species must also be considered whenever the purity of the deposited metal is important. Pyrolytic decomposition of metal alkyls, such as trimethylaluminum, are known to result in metallic deposits having significant carbon content. On the other hand, however, the pyrolysis of halogenated metals, such as tungsten hexafluoride, in the presence of reducing agents, result in very high quality metallic deposits.

The laser beam 22 is cylindrical and it decomposes the chemical species to deposit metal over a circular area across which the deposit diameter is measured. The magnitude of this deposit diameter will remain unchanged if the fabrication conditions are held constant and when such an unchanging deposit diameter is held at a fixed location, posts 14 configured as right circular cylinders will result. However, posts 14 having other configurations are possible, if conditions such as the thermal properties of the wafer, the laser spot size on the wafer, the energy or power output level of the laser, and the method utilized to charge the chemical species in the reaction chamber are varied during fabrication. One such post configuration which is particularly useful as the electrical and/or mechanical interconnections of this invention, has its maximum circular cross section at its base and is tapered therefrom to a right circular cylinder.

Although exceptions do exist to the following general information regarding the variability of post diameter with some of the above-mentioned conditions, it can be utilized when establishing initial conditions for obtaining particular post configurations. With the laser power held constant, the deposit diameter will vary in direct proportion to the laser spot size down to a submicron diffraction limit. With the laser spot size held constant, the deposit diameter will decrease dramatically as laser power is increased, and at a high enough laser power, the buildup of deposits become volcano shaped.

The wavelength of the laser is selected in accordance with whether photolytic or pyrolytic deposition is utilized. If photolytic deposition is utilized, a wavelength within the range of ultraviolet radiation is most frequently required but the actual magnitude thereof depends heavily on the molecular electronic structure of the chemical species. When pyrolytic deposition is utilized, the wavelength magnitude depends heavily on the characteristic of the wafer and most frequently falls within the range of visible-infrared radiation.

What we claim is:

1. A layered, integrated circuit assembly, comprising: a substrate having a planar major surface; electrical conductors lying on said major surface; elongated metal posts which have a first end connected to said conductors and which extend therefrom substantially perpendicular to said major surface; each of said metal posts having a second end which lies above said surface; a semiconductor device connected to said second end of said metal posts; said semiconductor device and said substrate being made of materials that expand and contract at different rates when they are subjected to temperature changes; and each of said metal posts having a length-to-width ratio which exceeds that which is possible for a metal bump of the same length; said posts being relatively flexible in comparison to said metal bumps and of the same length and operating to accommodate said different expansion rates without overstressing said semiconductor device.

2. The circuit assembly of claim 1 wherein each post has a length-to-width ratio of at least 10 to 1.

3. The circuit assembly of claim 1 wherein each post is tapered from a maximum circular cross section at only one end to a right circular cylinder.

4. The circuit assembly of claim 2 wherein each post has a width of no more than one mil.

5. The circuit assembly of claim 2 wherein each post has a graded metalization, with solder disposed as the final grade thereof.

6. The circuit assembly of claim 2 wherein each post consists of aluminum.

7. The circuit assembly of claim 2 wherein each post consists of nickel.

8. The circuit assembly of claim 3 wherein each post has a width of no more than one mil.

9. The circuit assembly of claim 3 wherein each post has a graded metalization, with solder disposed as the final grade thereof.

10. The circuit assembly of claim 3 wherein each post consists of aluminum.

11. The circuit assembly of claim 3 wherein each post consists of nickel.

* * * * *